United States Patent
Meredith et al.

(10) Patent No.: US 7,560,926 B2
(45) Date of Patent: Jul. 14, 2009

(54) B-VALUE OPTIMIZATION FOR DIFFUSION WEIGHTED MAGNETIC RESONANCE IMAGING

(75) Inventors: Glenn A. Meredith, Freehold, NJ (US); Christine H. Lorenz, Frederick, MD (US); Li Pan, Perry Hall, MD (US)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 12/238,587

(22) Filed: Sep. 26, 2008

(65) Prior Publication Data
US 2009/0096448 A1 Apr. 16, 2009

Related U.S. Application Data

(60) Provisional application No. 60/979,892, filed on Oct. 15, 2007.

(51) Int. Cl.
*G01V 3/00* (2006.01)
(52) U.S. Cl. .................................... 324/309; 324/307
(58) Field of Classification Search ............... 324/309, 324/307
See application file for complete search history.

(56) References Cited

U.S. PATENT DOCUMENTS

| | | | | |
|---|---|---|---|---|
| 5,786,692 | A * | 7/1998 | Maier et al. | 324/307 |
| 6,163,152 | A * | 12/2000 | Bernstein et al. | 324/306 |
| 6,670,812 | B1 * | 12/2003 | Mock et al. | 324/309 |
| 7,310,548 | B2 * | 12/2007 | Van Den Brink | 600/410 |
| 7,511,494 | B2 * | 3/2009 | Wedeen | 324/309 |

* cited by examiner

*Primary Examiner*—Louis M Arana
(74) *Attorney, Agent, or Firm*—Donald B. Paschburg

(57) ABSTRACT

A method for selecting the b-values for diffusion weighted magnetic resonance scans. The method includes: identifying a single reference slice within a volume of interest (VOI); progressively changing b-values over a plurality of scans of the reference slice wherein each one of the scans has a different b-value to obtain a plurality of diffusion weighted images; calculating ADC maps for combinations of b-values from the obtained plurality of diffusion weighted images; evaluating the calculated ADC maps; selecting from the evaluation optimal b-values; and using the selected b-values for subsequent scans.

12 Claims, 1 Drawing Sheet

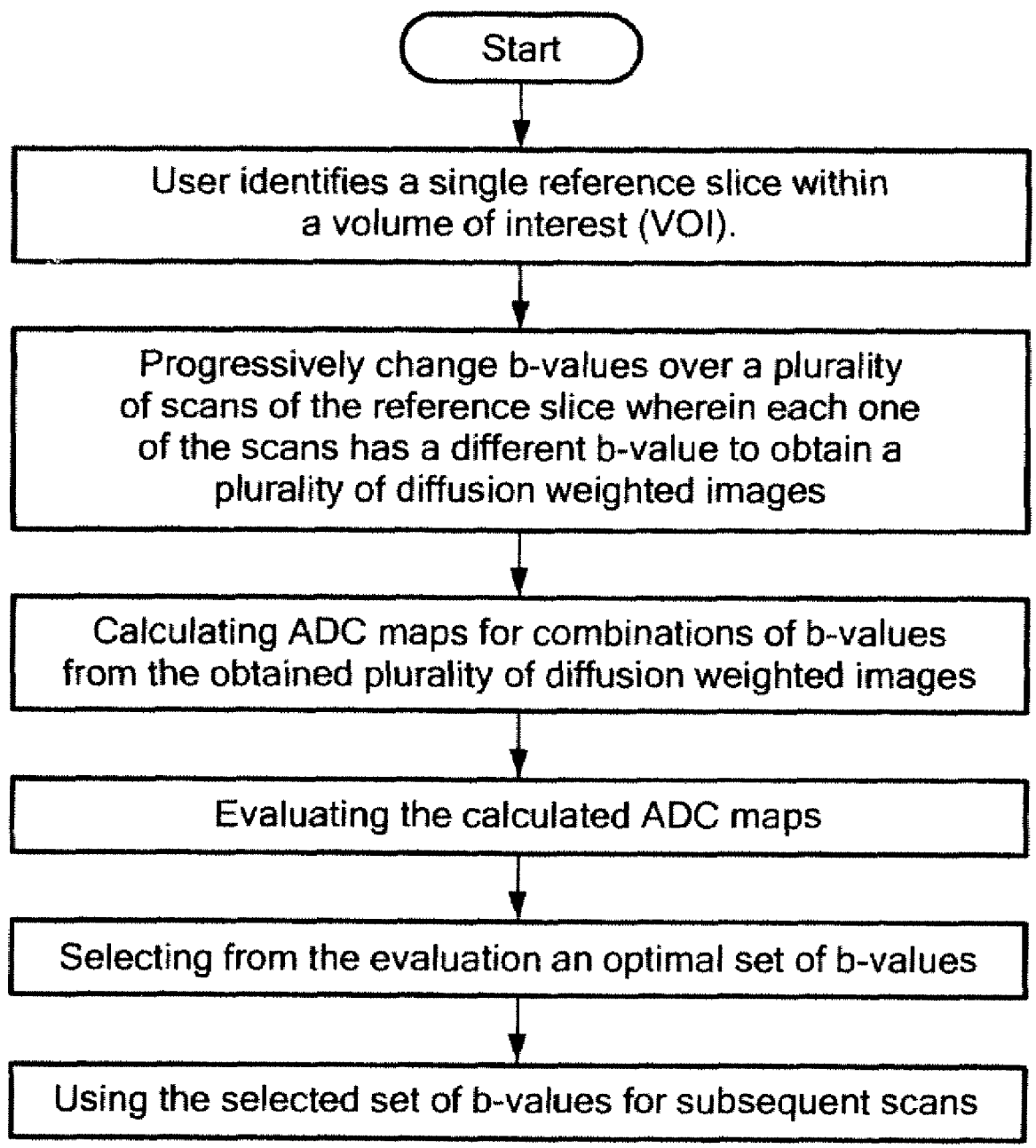

B-VALUE OPTIMIZATION FOR DIFFUSION WEIGHTED MAGNETIC RESONANCE IMAGING

CROSS-REFERENCE TO RELATED APPLICATIONS

This application claims priority from U.S. Provisional application No. 60/979,892 filed Oct. 15, 2007, the entire subject matter thereof being incorporated herein by reference.

TECHNICAL FIELD

This invention relates generally to Magnetic resonance imaging (MRI) and more particularly to diffusion weighted MRI imaging (DWI). Still more particularly, the invention relates to a method for optimizing the b-values to be used in diffusion weighted magnetic resonance imaging.

BACKGROUND

As is known in the art, Diffusion weighted imaging (DWI) is a method used in magnetic resonance imaging (MRI) and offers a means to evaluate an area of anatomy in terms of the motion of water molecules. The level of water diffusivity can provide an indication of the structure of the tissue at the cellular level. This in turn can provide an indication of the status of the tissue. In terms of tumors within an organ such as, for example, the liver, the water diffusivity within the tumor will be less than that of the healthy tissue of the organ. This is because the cancerous cells are denser, with more impediments to water motion. In a tumor which has undergone treatment to kill off the cancerous cells, the necrotic tumor will show an increase in diffusivity compared to the viable tumor. This is because, in killing the cancerous cells, the membranes are broken down, allowing greater motion of water molecules. Thus, measurement of water diffusivity can serve as a surrogate marker to evaluate tumor treatment response.

In DWI, the MR pulse sequence is designed in such a way as to produce higher signal intensity in proportion to the water diffusivity. The sequence's b-value parameter, which is related to the MR magnetic field gradient amplitude, is a key factor in controlling the diffusion weighting. The higher the b-value, the stronger the diffusion weighting. Conversely, the signal intensity falls in an exponential manner as a function of b-value. Therefore, the higher the b-value, the lower the signal intensity, and the higher the noise. Thus, there is a tradeoff in choosing the b-value such that it gives a strong diffusion weighting, but yet still has a high signal to noise ratio (SNR).

For a certain set of tissue types, the water diffusivity difference between the tissues will be most visible using a certain b-value. While there are some common guidelines as to what b-values should be used for certain tissue types, the results will vary by patient and other scan parameters and conditions. In general, the optimum b-value is considered to be that at which the maximum contrast-to-noise ratio is achieved. Since the optimum b-value for a certain patient, anatomy and scan is not known, the level of diffusivity is usually reported in terms of the apparent diffusion coefficient (ADC), which describes the rate of signal decay as a function of b-value and can be calculated from two or more images with different b-values (considering the slope of the line described by $\ln(SI(b)/SI(bo))$ where bo reflects no diffusion weighting); where SI is signal intensity and ln is the natural logarithm. In this way it is not necessary that any single scan is using the optimum b-value. By performing the ADC calculation on a pixel by pixel basis the results are presented as a parametric image often referred to as an ADC map.

However, depending on the b-values used, and the uncertainty in signal intensity in each image at a particular b-value, the resulting ADC values will have some degree of uncertainty, which decreases their diagnostic value, particularly in terms of doing follow-up studies where a comparison is being made between ADC values pre and post treatment.

In DWI studies usually multiple slices are being acquired for each dataset. For many cases, it is also desirable that the complete dataset be captured during one breath-hold to avoid motion of the anatomy and the need for registration within a single dataset. For this reason, and because each scan takes a fair amount of time, current practice is to make the best judgment in terms of what b-values to use to obtain the best ADC maps, and keep the number of scans with different b-values to a minimum.

SUMMARY

In accordance with the present invention, a method is provided for selecting a set of b-values for a diffusion weighted scan. The method includes: identifying a single reference slice within a volume of interest (VOI); progressively changing b-values over a plurality of scans of the reference slice within the VOI wherein each one of the scans has a different b-value to obtain a plurality of diffusion weighted images; calculating apparent diffusion coefficient (ADC) maps for combinations of b-values from the obtained plurality of diffusion weighted images; evaluating the calculated ADC maps; selecting from the evaluation optimal b-values; and using the selected b-values for subsequent scans.

In one embodiment, a method is provided for selecting a set of b-values for a diffusion weighted scan. The method includes: identifying a single reference slice having a position and orientation providing a representative view of the volume of interest (VOI); performing n scans, where n is an integer greater than 1, on the reference slice at progressively increasing b-values to provide a set of pre-scan reference images; interactively identifying a region of interest (ROI), or multiple ROI, within the reference slice and relevant regions outside of the ROIs for reference, with the ROIs identified in one image being propagated to the other images of different b-values; calculating ADC maps for combinations of b-values as such combinations are available from the set of pre-scan reference images, including calculating a subset of the maps based on only two b-values, and other maps being based on more than two b-values; evaluating each combination of b-values according to a plurality of criteria; and selecting the b-values based on the evaluation.

In one embodiment, the criterion includes one or more of: goodness of fit parameters in the ADC map calculations; error in predicting SI for each b-value image; SNR within the b-value image; SNR within the ROI; contrast between the ROI and surrounding regions; similarity measures in the ROI and surrounding regions.

In one embodiment, the evaluation includes a weighting scheme based on measures pertaining to complete ADC maps and b-value images: ADC goodness of fit, ADC error of prediction and b-value image SNR.

In one embodiment, the weighting scheme includes giving greater weight to pixels within the ROI and near to the ROI based on the level of SNR and contrast in the vicinity of the pixel in the b-value images.

The details of one or more embodiments of the invention are set forth in the accompanying drawings and the description below. Other features, objects, and advantages of the invention will be apparent from the description and drawings, and from the claims.

DESCRIPTION OF DRAWINGS

The single FIGURE is a flowchart of the method for selecting a set of b-values for a diffusion weighted scan according to the invention.

Like reference symbols in the various drawings indicate like elements.

DETAILED DESCRIPTION

Referring now to the single FIGURE, a flowchart is shown of a method for selecting a set of b-values for a diffusion weighted scan. The method includes: identifying a single reference slice within a volume of interest (VOI); progressively changing b-values over a plurality of scans of slices within the VOI wherein each one of the scans has a different b-value to obtain a plurality of diffusion weighted images; calculating ADC maps for combinations of b-values from the obtained plurality of diffusion weighted images; evaluating the calculated ADC maps; selecting from the evaluation an optimal set of b-values; and using the selected set of b-values for subsequent scans.

At the start of a DWI study, certain pre-scans are performed to provide input to the b-value optimization software application. After some user input in identifying the region(s) of interest, the application searches for the optimum b-values. After determining the optimum values as judged by certain evaluation criteria those values are automatically or manually set in preparation for the next scans in the protocol.

The method is described in greater detail as follows:

1. The user identifies a single reference slice, with a position and orientation which offers a representative view of the volume of interest (VOI). If the VOI is a mass with some regularity to its shape, the reference slice would usually be chosen so as to roughly pass through the middle of the VOI. The reference slice should provide a good representative 2D view of a section of the VOI where its borders are relatively well defined.
2. The scan control is set to perform some number n, where n is an integer greater than 1, scans of the reference slice, at progressively increasing b-values, at a predetermined interval.
3. The resulting pre-scan images are automatically made available in an optimization application.
4. In the optimization application the user interactively identifies the region of interest (ROI), or multiple ROI, within the reference slice, and relevant regions outside of the ROIs for reference. The ROIs identified in one image are propagated to the other images, with the ability to manually edit if necessary.
5. The optimization application calculates ADC maps for all possible combinations of b-values as are available from the set of pre-scan reference images. This includes some ADC maps calculated based on only two b-values, as well as ADC maps being calculated based on more than two b-values.
6. Each combination of b-values is evaluated according to multiple criteria, considering the individual b-value images, as well as the generated ADC maps. These criteria include goodness of fit, error of prediction, SNR, CNR and similarity measures. Some of the criteria consider the whole image or map, while others consider ROI(s) and the surrounding regions. Weights are given to each criteria in calculating an overall evaluation score.
7. Based on the evaluation scores, the optimal b-values are selected.
8. The optimal b-values are automatically or manually set in preparation for the next scans in the protocol.

A key component of the method is the evaluation algorithm which scores the ADC maps. Within that algorithm, the weighting scheme helps to minimize the effects of the ROI segmentation sometimes being less than perfect.

Described below are various optimization algorithms:

Each combination of b-values will be evaluated according to multiple criteria. Some of these criteria will relate to the ADC calculation itself, such as the goodness of fit parameters and the error in predicting SI for each b-value. As the SNR and contrast in an ADC map are dependent on those characteristics in the different b-value images from which the ADC map is derived, the evaluation algorithm will incorporate a weighting scheme based on the measurements of SNR and contrast in the b-value images. Since ADC is not expected to change regionally from pixel to pixel, similarity measures for adjacent pixels could also be used as part of the evaluation.

EXAMPLE 1 n different b value scans are acquired

For each possible combination of 2 or more b values we calculate the ADC map

The tissue(s) of interest are indicated by 'j' regions of interest (ROI's)

The following parameters are calculated over the whole image and/or within each ROI a goodness of fit value the error in predicting signal intensity (SI)

similarity metric the signal-to-noise ratio the contrast-to-noise ratio (applies only to ROI's and adjacent tissues)

For each combination of b values, the overall image evaluation score is:

$$\begin{aligned}\text{Overall image weighted score} =\\ ADC \text{ goodness of fit score} * \text{weight\_fit} + ADC \text{ error of}\\ \text{prediction score} * \text{weight\_prediction} + SNR * \text{weight\_SNR}\end{aligned}$$

Where weight_SNR and weight_CNR will be based on those measures in the b value images.

$$\begin{aligned}ROI \text{ weighted score}(i) \text{ where } i \text{ is the index of the given } ROI =\\ ADC \text{ goodness of fit score} * \text{weight\_fit} +\\ ADC \text{ error of prediction score} * \text{weight\_prediction} +\\ SNR * \text{weight\_SNR} + CNR * \text{weight\_CNR} +\\ \text{similarity measure} * \text{weight\_similarity}\end{aligned}$$

The overall image weighted score and the ROI weighted scores are combined into a global score for each combination of b-values, for example:

$$\begin{aligned}\text{Global score} =\\ \text{overall image weight score} * \text{weight\_overall} + ROI(j) * \text{weight\_ROI}(j)\end{aligned}$$

and the combination of b-values with the highest global weighted score is selected for subsequent scans.

EXAMPLE 2

A further adaptation of the algorithm in Example 1 is to set a range of acceptable global scores, and select the global score within that range that employs the smallest number of b-values to minimize subsequent scan time.

Alternatively, the number of b-values used for a particular ADC map could be added to the weighting scheme described above.

EXAMPLE 3

Alternatively linear optimization methods are employed to minimize the number of b-values used (to minimize scan time), while simultaneously maximizing one or more of the other computed metrics such as SNR.

Because the pre-scans are only being done on one slice, many different b-values can be explored in a relatively short time. Once the optimum b-values have been determined, they are then used for a complete multi-slice scan.

DWI studies will usually report quantitative results, such as the overall ADC value within an ROI, this being a key measure in evaluating the tissue and comparing its state between studies. The accuracy and reproducibility of these measures are of primary concern. This invention provides a quantitative approach for determining the b-values to be used to achieve the most accurate results.

A number of embodiments of the invention have been described. Nevertheless, it will be understood that various modifications may be made without departing from the spirit and scope of the invention. Accordingly, other embodiments are within the scope of the following claims.

What is claimed is:

1. A method for selecting a set of b-values for a diffusion weighted scan, comprising:
   identifying a single reference slice within a volume of interest (VOI);
   progressively changing b-values over a plurality of scans of the reference slice wherein each one of the scans has a different b-value to obtain a plurality of diffusion weighted images;
   calculating ADC maps for combinations of b-values from the obtained plurality of diffusion weighted images;
   evaluating the calculated ADC maps;
   selecting from the evaluation optimal b-values; and
   using the selected b-values for subsequent scans.

2. A method for selecting a set of b-values for a diffusion weighted scan, comprising:
   identifying a single reference slice having a position and orientation providing a representative view of the volume of interest (VOI);
   performing n scans, where n is an integer greater than 1, on the reference scan at progressively increasing b-values to provide a set of pre-scan reference images;
   interactively identifying a region of interest (ROI), or multiple ROI, within the reference slice and relevant regions outside of the ROI(s) for reference, with the ROIs identified in one scan being propagated to the other images;
   calculating ADC maps for combinations of b-values as such values are available from the set of pre-scan reference images including calculating a subset of the maps based on only two b-values, and the other maps being based on more than two b-values,
   evaluating each combination of b-values according to a plurality of criteria;
   selecting optimal b-values based on the evaluation; and
   using the selected b-values for subsequent scans.

3. The method recited in claim 2 wherein the criterion includes one or more of: goodness of fit parameters in the ADC map calculations; the error in predicting SI for each b-value image; SNR within the b-value image; SNR within the ROI; contrast between the ROI and surrounding regions; similarity measures in the ROI and surrounding regions.

4. The method recited in claim 1 wherein the evaluation includes a weighting scheme based on the measures pertaining to complete ADC maps and b-value images, ADC goodness of fit, ADC error of prediction and b-value image SNR.

5. The method recited in claim 4 wherein the weighting scheme includes giving greater weight to pixels within the ROI and near to the ROI based on the level of SNR and contrast in the vicinity of the pixel in the b-value images.

6. The method recited in claim 1 wherein the evaluation includes a weighting scheme based on the measurements of SNR and contrast in the b-value images.

7. The method recited in claim 4 wherein the weighting scheme includes obtaining an overall image weighted score.

8. The method recited in claim 5 wherein the weighting scheme includes obtaining an overall image weighted score and obtaining ROI weighted scores, which are all combined into a global score for each combination of b-values.

9. The method recited in claim 8 including setting a range of acceptable global scores, and selecting the global score within that range that employs the smallest number of b-values to minimize subsequent scan time.

10. The method recited in claim 4 wherein the weighting scheme includes adding the number of b-values used for a particular ADC map into the weighting scheme.

11. The method recited in claim 2 including using linear optimization methods to minimize the number of b-values used to minimize scan time while simultaneously maximizing one or more of the other computed metrics.

12. The method recited in claim 11 wherein one of the metrics is SNR.

* * * * *